United States Patent [19]
Kawarazaki

[11] Patent Number: 5,835,551
[45] Date of Patent: Nov. 10, 1998

[54] VARIABLE RATE OUTPUT PULSE GENERATOR

[75] Inventor: Futoshi Kawarazaki, Tokyo, Japan

[73] Assignee: Ando Electric Co., Ltd., Tokyo, Japan

[21] Appl. No.: 880,451

[22] Filed: Jun. 24, 1997

[30] Foreign Application Priority Data

Jun. 27, 1996 [JP] Japan .................................. 8-186748

[51] Int. Cl.$^6$ .................................................. G11C 19/00
[52] U.S. Cl. ............................... 377/20; 377/54; 327/114; 327/299
[58] Field of Search ................................. 377/20, 16, 54; 327/114, 299

[56] References Cited

U.S. PATENT DOCUMENTS 5,521,848  5/1996  Bayne et al. ............................... 377/16

*Primary Examiner*—Margaret Rose Wambach
*Attorney, Agent, or Firm*—Flynn, Thiel, Boutell & Tanis, P.C.

[57] ABSTRACT

The invention provides a high speed variable rate output pulse generating circuit for a semiconductor testing device. The circuit includes a shift register formed of 2n number of flip-flops which counts the lower bits of lower counter data selected by a selector, a ripple down counter formed of m number of flip-flops counts the upper bits of upper counter data selected by a NOR gate. A counting end judgment circuit for judging an end of counting the ripple down counter and the shift register produces a counting end signal. A first flip-flop latches the counting end signal to supply a counter load signal to the selector and the NOR gate to load subsequent data, and a second flip-flop generates a first output clock pulse.

10 Claims, 6 Drawing Sheets

LOADING COUNTER DATA    LOADING COUNTER DATA

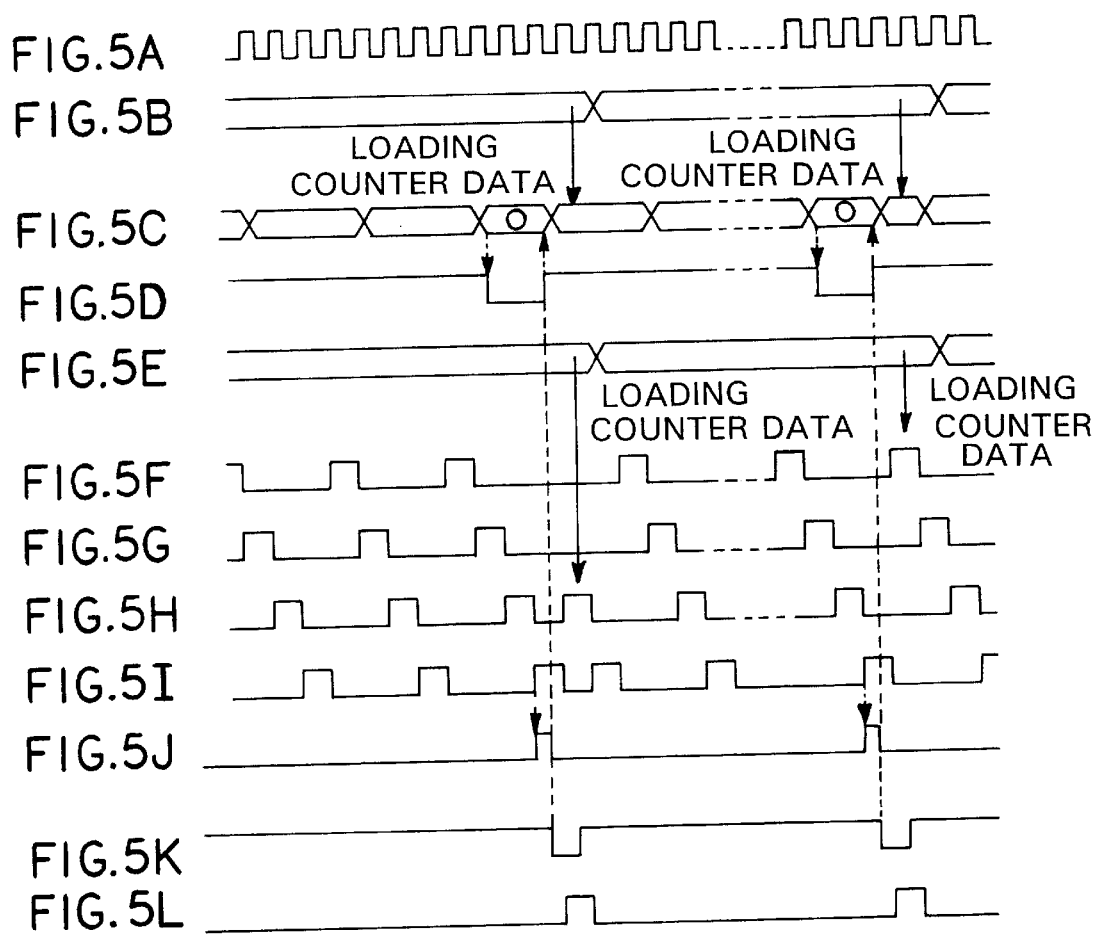

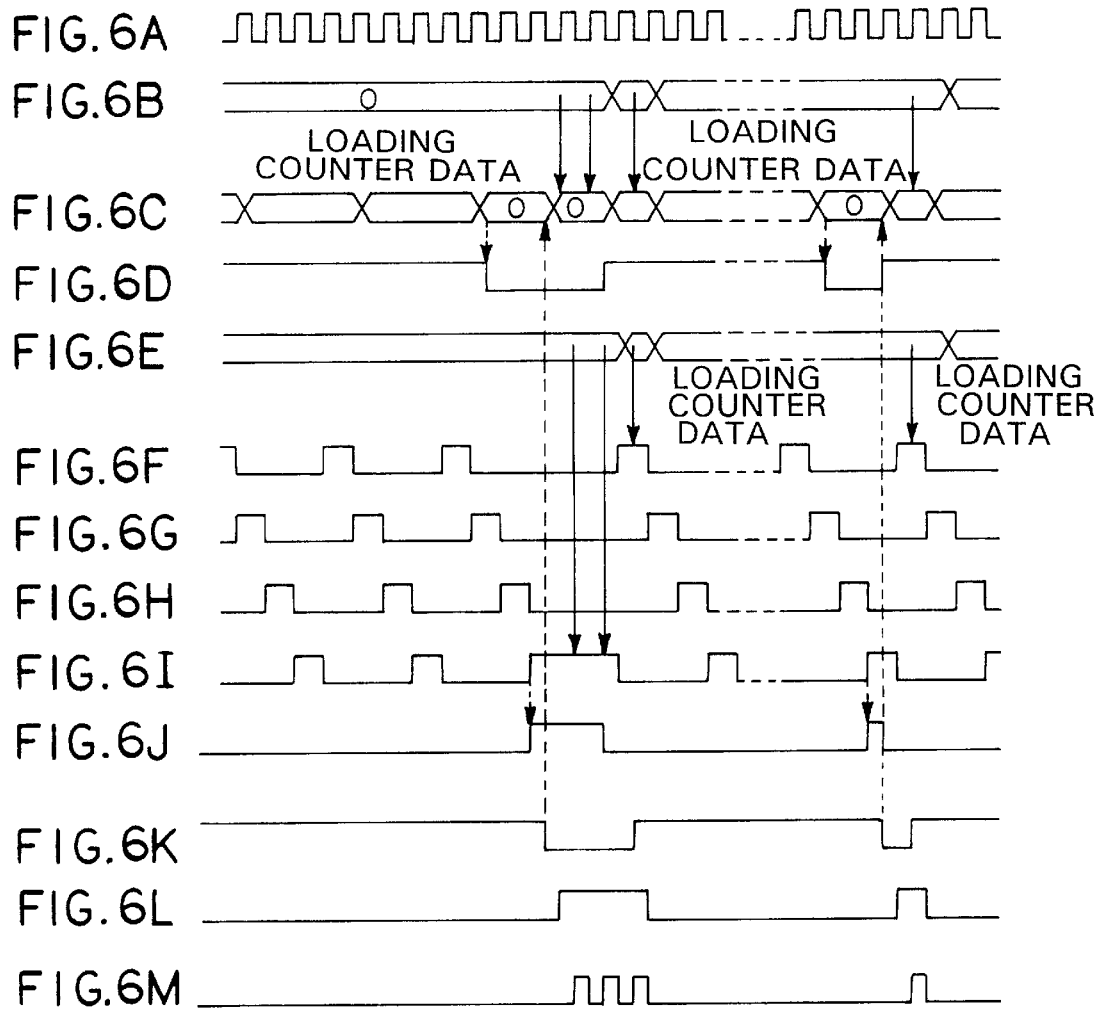

VARIABLE RATE OUTPUT PULSE GENERATOR

BACKGROUND OF THE INVENTION

1. Field of the Invention

The present invention relates to a variable rate output pulse generating circuit for a semiconductor testing device in which upper bits of the counter are designed to be counted by a ripple down counter and lower bits are designed to be counted by a shift register so as to vary a timing in real time.

2. Description of the Related Art

To measure a semiconductor generally needs to set a timing for a clock pulse applied to the semiconductor. Accordingly, variable rate output pulse generator circuit becomes necessary which can produce output clock pulse at a variable rate real time.

A construction of a conventional rate generating circuit will be described with reference to FIG. 3. In FIG. 3, a ripple down counter 3 is configured with m number of flip-flops (hereunder, referred to as FF) 12~15 cascaded.

An input clock pulse enters a clock input terminal of the FF 12, and an output from an output terminal Q of the FF 12 sends out to a clock input terminal of a subsequent stage FF 13, hereafter, each of the clock input terminals of the FFs 14 and 15 receives an output from the FF in the previous stage.

Each of the outputs from the output terminals Q of the FFs 12~15 sends out to each of input terminals of a NOR gate 17. Each of outputs from output terminals Q bar of the FFs 12~15 enters an input terminal D of its own.

A NOR gate 4 is configured with a NOR gate circuits 4a~4h. Each of outputs from the NOR gate circuits 4a~4d enters each of set input terminals S of the FFs 12~15, respectively. Each of outputs from the NOR gate circuits 4e~4h enters each of reset input terminals R of the FFs 12~15, respectively.

An output from an output terminal Q bar of a FF 7 enters one input terminals of the NOR gate circuits 4a~4h. Each of counter data B1 bar~Bm bar enters each of the other input terminals of the NOR gate circuits 4a~4d, respectively. Each of counter data B1~Bm enters each of the other input terminals of the NOR gate circuits 4e~4h, respectively.

The foregoing NOR gate 17 receives at its input terminals the outputs from the output terminals Q of the FFs 12~15 to judge an end of counting, and an output 17a from the NOR gate 17 enters an input terminal D of the FF 7.

A clock input terminal of the FF 7 receives the foregoing input clock pulse a. The FF 7 latches the output 17a from the NOR gate 17, and the output terminal Q bar of the FF 7 sends out a counter load signal 7a to each of the one input terminals of the NOR gate circuits 4a~4h of the NOR gate 4. The ripple down counter 3 loads a subsequent counter data by means of this counter load signal 7a. The output signal from the output terminal Q of the FF 7 enters an input terminal D of a FF 8.

A clock input terminal of the FF 8 receives the input clock pulse a, whereby the FF 8 produces an output clock pulse 8a from the output terminal Q thereof.

Next, the operation will be described. The counter load signal 7a is judged by the NOR gate 4, the counter data B1~Bm are taken in by the ripple down counter 3. When a count value "3" (FIG. 4B) is set, for example, the counter data B1 and B2 are set to "1", and the others are set to "0". Each of the counter data B1 bar~Bm bar is taken in by each of the set input terminals S of the FFs 12~15, respectively. Each of the counter data B~Bm is taken in by each of the reset input terminals R of the FFs 12~15, respectively.

The ripple down counter 3 counts down by means of the input clock pulse a (FIG. 4A) received at each of the clock input terminals of the FFs 12~15. The outputs generated at each of the output terminals Q of the FFs 12~15 are sent out to the inputs of the NOR gate 17 (FIG. 4C), whereby the NOR gate 17 recognizes one clock before a value of the ripple down counter 3 becomes "0".

The output 17a from the NOR gate 17 (FIG. 4E) enters the input terminal D of the FF 7 and the input clock pulse a enters the clock input terminal of the FF 7, whereby the FF 7 latches the output 17a and sends out the counter load signal 7a to each of the one input terminals of the NOR gate circuits 4a~4h, and the FF 8 receives the output from the output terminal Q of the FF 7 at the input terminal D thereof to produce a first output clock pulse 8a (FIG. 4F).

The counter data B1~Bm are varied each time the first output clock pulse 8a is produced, whereby a timing of the first output clock pulse 8a can be varied. This timing is determined by (a period of the input clock pulse a)_(a count value).

However, this conventional rate generating circuit does not work, unless the delay time from the FF 12 of the lowest bit to the FF 15 of the highest bit of the ripple down counter 3 in FIG. 3 is within a period from a rising edge to a falling edge of the input clock pulse a, which is a problem to be solved.

Further, since the FF 7 is used which latches the output 17a by the input clock pulse a, the FF 8 to feed the output clock pulse 8a cannot produce a clock pulse of the same period as that of the input clock pulse a, which is another problem.

SUMMARY OF THE INVENTION

The present invention has been made in view of the foregoing problems, and an object of the present invention is to provide a high-speed variable rate output pulse generating circuit for use in a semiconductor testing device.

In order to solve the foregoing problems and to accomplish the foregoing object, a variable output pulse rate generating circuit according to the invention comprises: a shift register 1 formed of 2n number of flip-flops 21~24, served as a counter for counting the lower bits; a ripple down counter 3 for counting the upper bits, formed of m number of flip-flops; a selector 2 for selecting lower counter data A0~A2n−1 for the shift register 1; a NOR gate 4 for receiving upper counter data B1~Bm for the ripple down counter 3; a counting end judgment circuit 5A for judging an end of counting in the ripple down counter 3 and the shift register 1; a flip-flop 7 for latching a counting end signal 6a supplied from the counting end judgment circuit 5A to generate a counter load signal 7a for loading subsequent data into the ripple down counter 3 and the shift register 1; and a flip-flop 8 for receiving an output from the flip-flop 7 to generate a first output clock pulse 8a by receiving an input clock pulse a.

Further, another variable output pulse rate generating circuit according to the invention comprises: a shift register 1 formed of 2n number of flip-flops 21~24, served as a counter for counting the lower bits; a ripple down counter 3 for counting the upper bits, formed of m number of flip-flops; a selector 2 for selecting lower counter data A0~A2n−1 for the shift register 1; a NOR gate 4 for receiving upper counter data B1~Bm for the ripple down counter 3; a counting end judgment circuit 5A for judging an end of counting in the ripple down counter 3 and the shift register 1; a flip-flop 7 for latching a counting end signal 6a supplied from the counting end judgment circuit 5A to generate a counter load signal 7a for loading subsequent data into the ripple down counter 3 and the shift register 1; a flip-flop 8 for receiving an output from the flip-flop 7 to generate a first output clock pulse 8a by receiving an input clock pulse a; and an AND gate 16 for making a logical product by the first output clock pulse 8a and an inverted signal of the input clock pulse a to generate a second output clock pulse 16a.

BRIEF DESCRIPTION OF THE DRAWINGS

The present invention will become more fully understood from the detailed description given hereinbelow and the accompanying drawings which are given by way of illustration only, and thus are not limitative of the present invention and wherein:

FIGS. 5A, 5B, 5C, 5D, 5E, 5F, 5G, 5H, 5I, 5J, 5K and 5L are timing diagrams depicting the signals produced by some of the components of the variable rate output pulse generator of FIG. 1; and FIGS. 6A, 6B, 6C, 6D, 6E, 6F, 6G, 6H, 6I, 6J, 6K, 6L and 6M are timing diagrams depicting the signals produced by some of the components of the variable rate output pulse generator of FIG. 2.

DESCRIPTION OF THE PREFERRED EMBODIMENT

Figure 1:
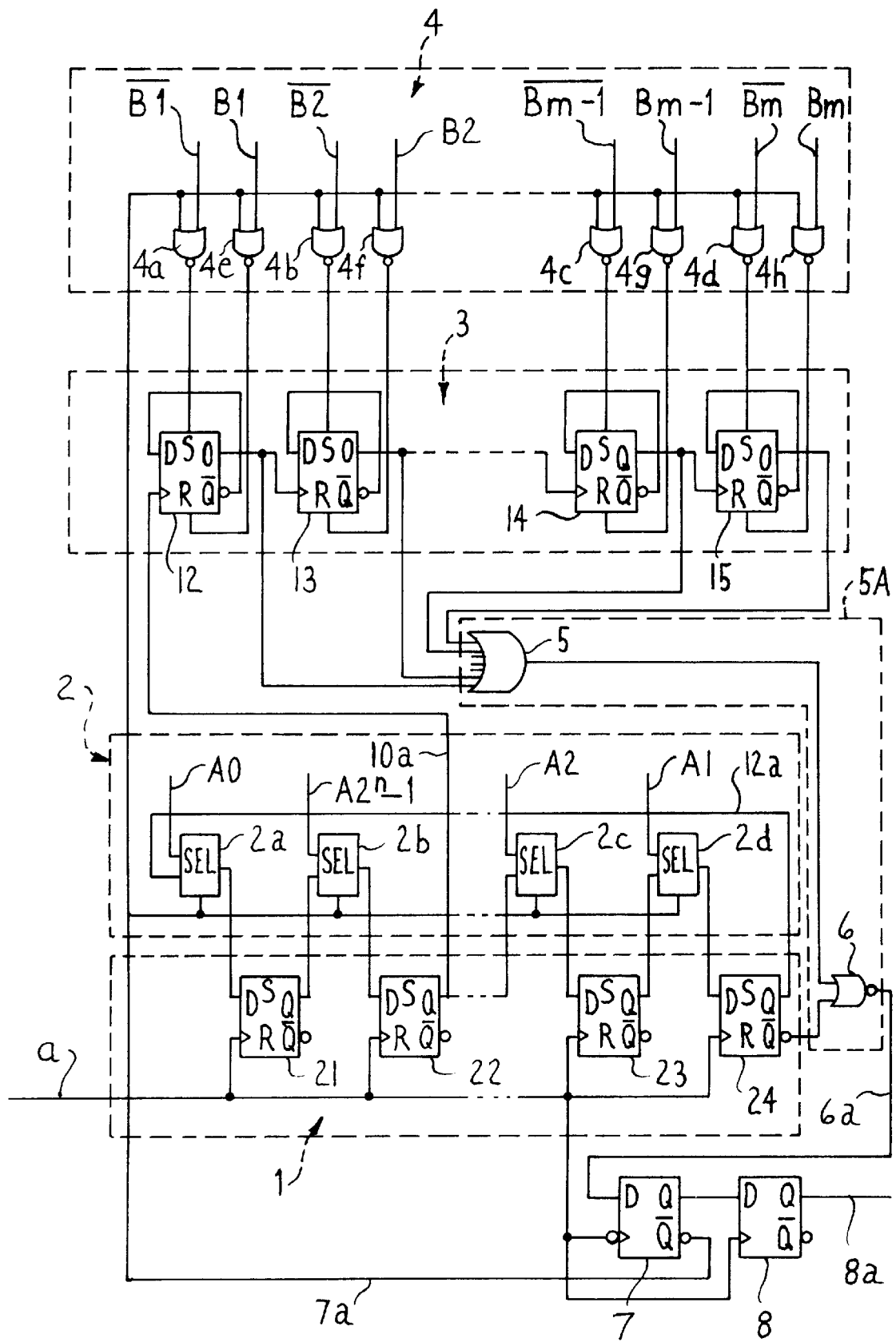
FIG. 1 is a circuit diagram showing a construction of a first embodiment of a rate generating circuit according to the present invention.

According to a variable rate output pulse generating circuit of the invention, a NOR gate 4 judges upper counter data B1~Bm on the basis of a counter load signal 7a supplied from a flip-flop 7 and sends out the upper counter B1~Bm to a ripple down counter 3. A selector 2 selects lower counter data A0~A2n−1 for the ripple down counter 3. The shift register 1 takes in the lower counter data A0~A2n−1, and the output of the shift register 1 is fed back to the input. When a data pulse makes one round in the shift register 1, the shift register 1 outputs a shift-down signal to the ripple down counter 3, causing the ripple down counter 3 to count down. A counting end judgment circuit 5A judges an end of counting in the ripple down counter 3 and shift register 1 from an output of the ripple down counter 3 and an output from the shift register 1. A counter load 7 latches a counting end signal 6a from a NOR gate 6, and generates a counter load signal 7a for loading subsequent data into the ripple down counter 3 and the shift register 1. Further, an output signal from the flip-flop 7 enters an output pulse flip-flop 8, and the flip-flop 8 generates a first output clock pulse 8a.

Further, according to another variable output pulse rate generating circuit of the invention, a NOR gate 4 judges upper counter data B1~Bm on the basis of a counter load signal 7a supplied from a flip-flop 7 and sends out the upper counter data B1~Bm to a ripple down counter 3. A selector 2 selects lower counter data A0~A2n−1 for the ripple down counter 3. The shift register 1 takes in the lower counter data A0~A2n−1, and the output of the shift register 1 is fed back to the input. When a data makes one round in the shift register 1, the shift register 1 outputs a shift-down signal to the ripple down counter 3, making the ripple down counter 3 to count down. A counting end judgment circuit 5A judges an end of counting in the ripple down counter 3 and shift register 1 from an output of the ripple down counter 3 and an output from the shift register 1. A flip-flop 7 latches a counting end signal 6a from a NOR gate 6 and generates a counter load signal 7a for loading subsequent data into the ripple down counter 3 and the shift register 1. Further, an output signal from the flip-flop 7 enters a flip-flop 8, and the flip-flop 8 generates a first output clock pulse 8a. Furthermore, an AND gate 16 makes a logical product by the first output clock pulse 8a and an inverted signal of an input clock pulse a to generate a second output clock pulse 16a.

Next, the first embodiment of a rate generating circuit according to the invention will be described with reference to the accompanying drawings. FIG. 1 is a circuit diagram showing the construction of the circuit. In FIG. 1, the same parts as in FIG. 3 are given the identical references to avoid repeated explanations, and the different parts from FIG. 3 will be described with a primary attention.

Figure 3:
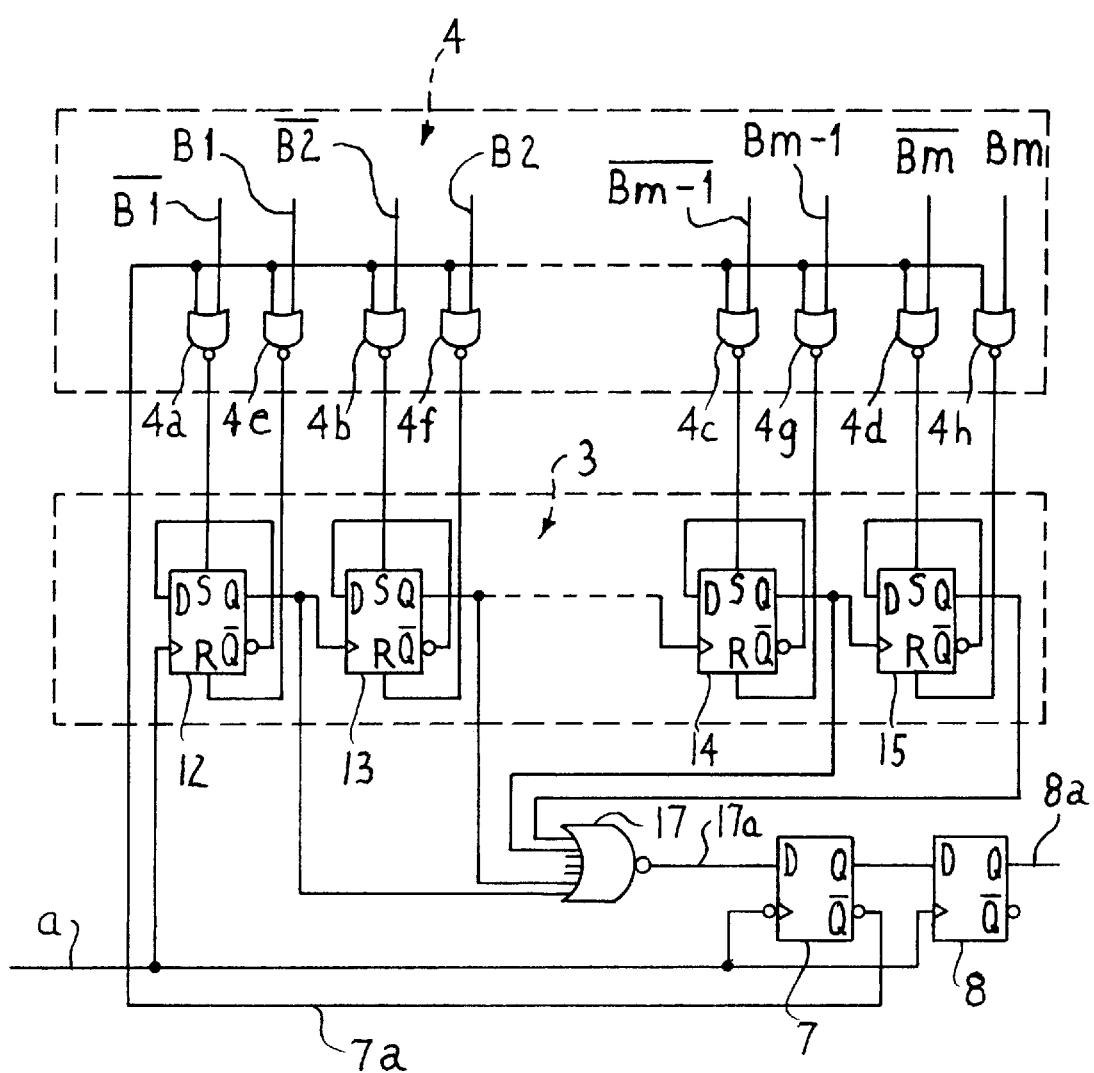
FIG. 3 is a circuit diagram showing a construction of a conventional rate generating circuit.
Figure 4A:
FIGS. 4A, 4B, 4C, 4D, 4E and 4F are timing diagrams depicting the signals produced by some of the components of the prior art output pulse circuit of FIG. 3.
Figure 4B:
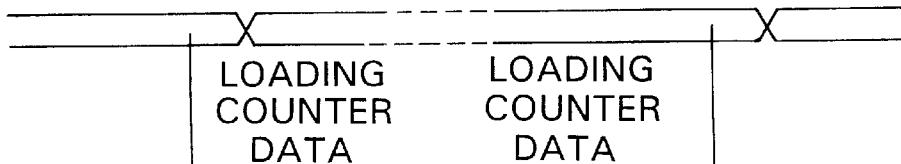
Figure 4C:
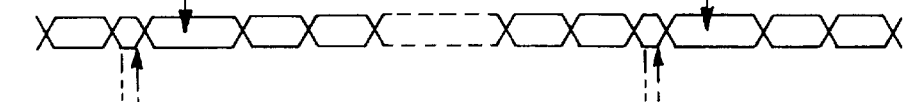
Figure 4D:
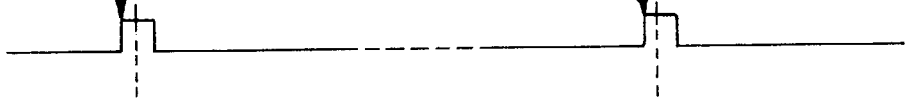
Figure 4E:
Figure 4F:
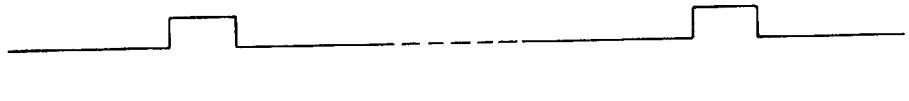

As clearly seen from contrast of FIG. 1 and FIG. 3, a NOR gate 4, ripple down counter 3, OR gate 5, FF 7, and FF 8 in FIG. 1 are the same as in FIG. 3; and a shift register 1, selector 2, and NOR gate 6 are newly added.

The shift register 1 is composed of 2n number of FFs 21~24, and is served as a counter for counting the lower bits. The input clock pulse a commonly enters each of the clock input terminals of the FFs 21~24. Each of outputs from selector circuits 2a~2d constituting the selector 2 enters each of the input terminals D of the FFs 21~24.

Further, each of output signals from the output terminals Q of the FFs 21, 22, 23 enters each of the selector circuits 2b, 2c, 2d, respectively. The output signal from the output terminal Q of the FF 24 enters the selector circuit 2a. The output signal from an output terminal Q bar enters one input terminal of the NOR gate 6.

Further, instead of feeding the input clock pulse a to the clock input terminal of the FF 12 in the ripple down counter 3 as in the conventional example in FIG. 3, the output signal from the output terminal Q of the FF 22 enters the clock input terminal of the FF 12 as a shift-down signal in this first embodiment.

The foregoing selector 2 is to select the lower counter data A0~A2n−1 for the shift register 1. When the selector 2 takes in the lower counter data A0~A2n−1, the counter load signal 7a from the output terminal Q bar of the FF 7 enters each of the selector circuits 2a~2d, whereby the selector circuits 2a~2d selects and takes in the lower counter data A0~A2n−1.

Further, the counter load signal 7a also enters the NOR gate circuits 4a~4h of the NOR gate 4 in the same manner as in FIG. 3.

Further, each of the output signals from the output terminals Q of the FFs 12~15 in the foregoing ripple down counter 3 enters each of the input terminals of the OR gate 5. The output from the OR gate 5 enters the other input terminal of the NOR gate 6.

The OR gate 5 and the NOR gate 6 form the counting end judgment circuit 5A for judging an end of counting in the ripple down counter 3 and the shift register 1.

A counting end signal 6a supplied from the NOR gate 6 enters the input terminal D of the FF 7; and since the connection relating to the FF 7 and FF 8 is the same as in FIG. 3, the description as to the connection will be omitted.

Next, the operation of the embodiment in FIG. 1 thus constructed will be described. The input clock pulse a (FIG. 5A) enters each of the clock input terminals of the FF 21~FF 24 in the shift register 1 and each of the clock input terminals of the FF 7 and FF 8.

The input clock pulse a enters the clock input terminal of the FF 7 to produce the counter load signal 7a, (FIG. 5K) which is sent out from the output terminal Q bar of the FF 7 to each of one input terminals of the NOR gate circuits 4a~4h of the NOR gate 4 and to each of the selector circuits 2a~2d of the selector 2.

The counter load signal 7a enters the NOR gate circuits 4a~4h of the NOR gate 4, and thereby, each of the NOR gate circuits 4e~4h makes a negative logical sum of the counter load signal 7a and either one of the upper counter data taken in out of the upper counter data B1~Bm, which resets FFs of the FFs 12~15 (FIG. 5E) corresponding to the NOR gate circuits that made negative logical sums.

On the other hand, each of the NOR gate circuits 4a~4d makes a negative logical sum of the counter load signal 7a and either one of negative values B1 bar~Bm bar taken in out of negative values B1 bar~Bm bar of the upper counter data, which resets FFs of the FFs 12~15 corresponding to the NOR gate circuits that made the negative logical sums.

Further, the foregoing counter load signal 7a enters each of the selector circuits 2a~2d of the selector 2 (FIG. 5E), and each of the selector circuits 2a~2d selects the counter data A0~A2n−1 and sends out to each of the FFs 21~24 in the shift register 1.

Each of the outputs from the FFs 21~24 in the shift register 1 is sequentially fed back to each of the selector circuits 2b, 2c, 2d, and 2a of the selector 2, respectively, and repeatedly shifted (FIGS. 5F, 5G, 5H and 5I, respectively). And, every time when the outputs from the FFs 21~24 in the shift register 1 make one round, the shift-down signal 10a enters the clock input terminal of the FF 12 in the ripple down counter 3 from the output terminal Q of the FF 22 in the shift register 1.

Thereby, the ripple down counter 3 executes a down-counting (FIG. 5C). The output signals from the output terminals Q of the FFs 12~15 in the ripple down counter 3 enter the input terminals of the OR gate 5, through which the result (FIG. 5D), namely, the logical sum enters the other input terminal of the NOR gate 6. The one input terminal of the NOR gate 6 receives the output signal from the output terminal Q bar of the FF 24 in the shift register 1. The NOR gate 6 makes the negative logical sum of the foregoing two, and the result, namely the counting end signal 6a (FIG. 5J) is sent out to the input terminal D of the FF 7.

In other words, the counting end judgment circuit 5A comprised of the OR gate 5 and the NOR gate 6 judges an end of counting in the ripple down counter 3 and the shift register 1. When the ripple down counter 3 and the shift register 1 end the counting, the counting end signal 6a is sent out from the NOR gate 6 to the FF 7, as described above.

When a counting is executed in the ripple down counter 3, as to any count value up to 2n−1, the data to be loaded into the FFs 21~24 out of the lower counter data A0~A2n−1 are set to "1". When the count value is a multiple of 2n, the count value A is set to "1". When the count value is 2n, for example, the lower counter data A0 and the upper counter data B1 are set to "1". As to the count value of more than 2n−1, the count value is set to a sum of the upper counter data B1~Bm and the lower counter data A1~A2n−1.

Taking a delay time into consideration, from the moment that the shift-down signal 10a is sent out to the ripple down counter 3 until (2n−1) input clock pulses a are sent out to the clock inputs of the FFs 21~24 in the shift register 1, an output 12a from the shift register 1 does not become "1", and the counting does not come to an end. It is only needed that the highest bit of the ripple down counter 3 changes in the meantime.

Thereby, the rate generating circuit according to the invention is operational to a period such that a delay time from the lowest bit of the ripple down counter 3 to the highest bit thereof is within a period during which (2n−1) pulses of the input clock pulse a enter the shift register 1.

As described above, the counting end judgment circuit 5A judges an end of counting in the ripple down counter 3 and the shift register 1, and thereby the counting end signal 6a supplied from the NOR gate 6 enters the FF 7 to be latched therein. Accordingly, the FF 7 feeds the abovementioned counter load signal 7a (FIG. 5K) from the output terminal Q bar thereof to the one input terminals of the NOR gate circuits 4a~4h in the NOR gate 4 and to the selector circuits 2a~2d in the selector 2 so as to load subsequent data into the ripple down counter 3 and the shift register 1.

Simultaneously with feeding the counter load signal 7a, the FF 7 feeds the output signal from the output terminal Q thereof to the input terminal D of the FF 8. Thereby, the FF 8 generates the first clock pulse 8a (FIG. 5L) from the output terminal Q.

Figure 2:
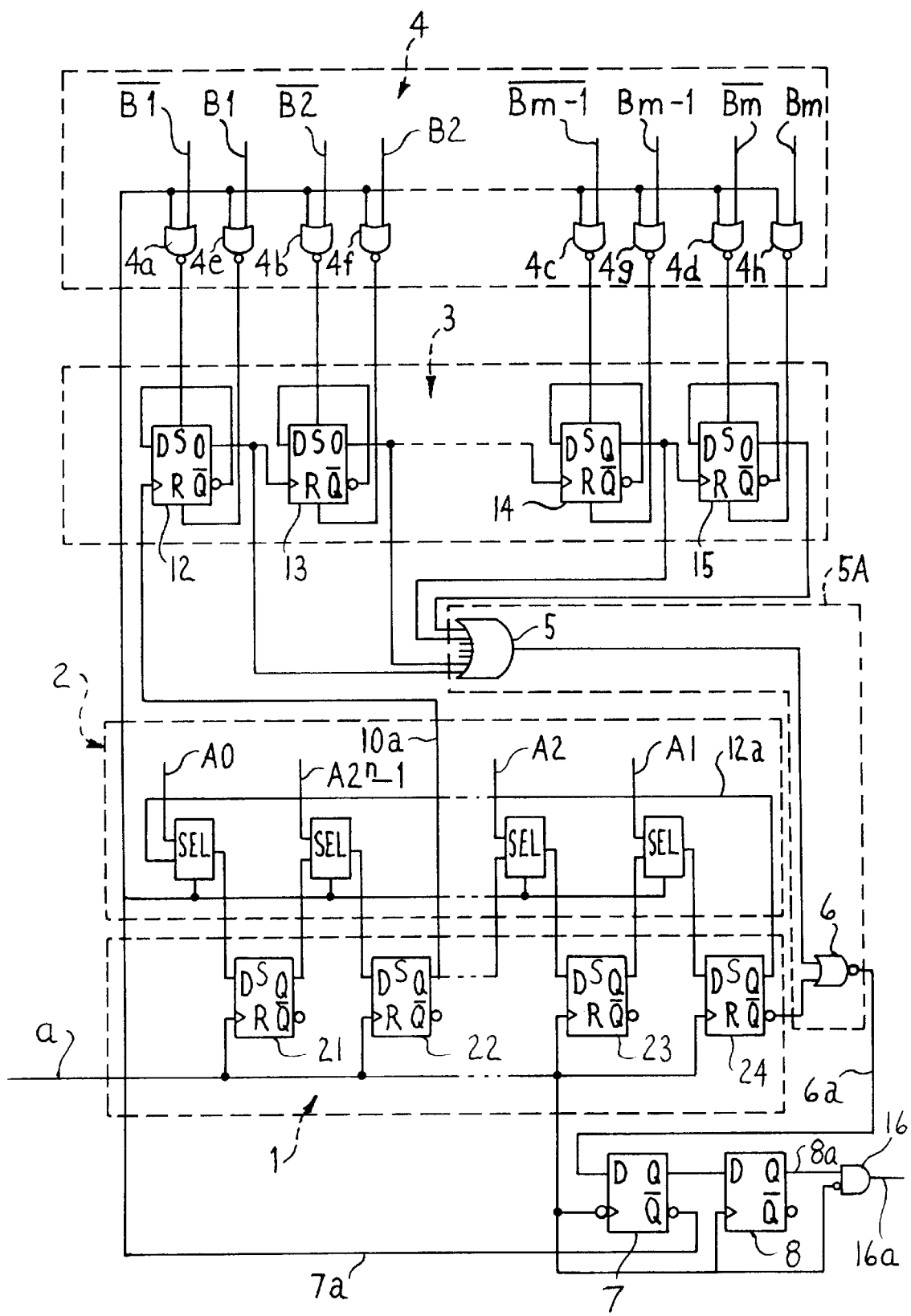
FIG. 2 is a circuit diagram showing a construction of a second embodiment of a rate generating circuit according to the present invention.

FIG. 2 is a circuit diagram showing a construction of the second embodiment according to the present invention. The second embodiment includes the same components as the first embodiment. FIGS. 6A through 6L, which are equivalent to FIGS. 5A through 5L, respectively, illustrate how the components of the second embodiment operate the same way as the components of the first embodiment. The second embodiment in FIG. 2 further comprises, at the subsequent stage of the FF 8 in the first embodiment, an AND gate 16 for making a logical product by the first output clock pulse 8a supplied from the FF 8 and an inverted signal of the input clock pulse a; and thereby, the AND gate 16 is designed to generate a second output clock pulse 16a (FIG. 16M).

In the first embodiment, when the count value is set to "1", the upper counter data B1~Bm are set to "0" and the lower counter data A0~A2n−1 are set to "1", the FF 8 continues to supply "1", which does not make a pulse. However, in the second embodiment, since the AND gate 16 makes a logical product by the first output clock pulse 8a and an inverted signal for the input clock pulse a, the pulse width of the second output clock pulse 16a can be narrowed. Accordingly, the second output clock pulse 16a can be generated at an identical timing with the input clock pulse a.

According to a rate generating circuit of the invention, a counter for counting the upper bits is formed by a ripple down counter, a counter for counting the lower bits is formed by a shift register, an input data for the shift register is selected by a selector, a count data for the ripple down counter is selected by a NOR gate, an end of counting in the shift register and the ripple down counter is judged by a counting end judgment circuit, an output from the counting end judgment circuit is latched by a FF to generate a counter load signal, thereby subsequent data are loaded into the shift register and the ripple down counter, and a first output clock pulse is designed to be generated from another FF; and therefore, a high-speed rate can be generated, whereby a timing can be varied in real time.

Further, according to another rate generating circuit of the invention, in addition to the foregoing construction, an AND gate is added which makes a logical product by a first output clock pulse and an inverted signal of an input clock pulse. Accordingly, in addition to the foregoing effect, the rate generating circuit according to the second embodiment increases the operational frequency, and generates an output at an identical timing with an input clock pulse.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A variable rate output pulse generator for generating an output signal pulse in response to the application of a variable number of input clock pulses, said output pulse generator comprising:

a shift register having 2n flip-flops for cyclically performing a lower bit down count, wherein an end shift register flip-flop asserts a lower bit count signal upon completion of the lower bit down count and one of said shift register flip-flops periodically asserts a shift-down pulse in response to said shift register receiving a set number of clock pulses;

a ripple down counter having m flip-flops for cyclically performing an upper bit down count, wherein said ripple down counter is connected to said shift register for receiving the shift-down-pulses and said ripple down counter flip-flops are configured to perform the upper bit down count down count in response to receipt of the shift-down pulses and to generate an upper bit count signal after a variable number of shift-down pulses are received;

a selector connected to said shift register flip-flops for establishing the number of clock pulses that are to be received by said shift register before said shift register asserts the lower bit count signal, wherein said selector establishes the number of clock pulses in response to lower bit counter data applied to said selector when said selector receives a selector data load signal;

a NOR gate assembly connected to said ripple down counter flip-flops for controlling said ripple down counter flip-flops to establish the number of shift down pulses that are to be received by said ripple down counter before said ripple down counter asserts said upper bit count signal, wherein said NOR gate assembly establishes the number of shift down pulses in response to upper bit counter data applied to said NOR gate assembly when said ripple down counter receives a NOR gate data load signal;

a counting end circuit for receiving said lower bit count signal and said upper bit count signal for asserting a counting end signal when both said lower bit count signal and said upper bit count signal are received;

a counter load flip-flop for receiving the counting end signal, said counter load flip-flop being configured to assert a count load signal for a fixed period of time when said counting end signal is received, wherein said counter load flip-flop forwards said counter load signal to said selector as said selector data load signal and to said NOR gate assembly as said NOR gate data load signal; and an output pulse flip-flop connected to said counter load flip-flop for receiving said counter load signal, wherein when the counter load signal is received, said output pulse flip-flop asserts an output signal pulse.

2. The output pulse generator of claim 1, wherein: said ripple down counter further includes an OR gate connected to receive the outputs of said ripple down flip-flops for producing said upper bit count signal.

3. The output pulse generator of claim 2, wherein said counting end circuit includes a NOR gate connected to receive said lower bit count signal and said upper bit count signal and that produces said counting end signal.

4. The output pulse generator of claim 1, wherein said counting end circuit includes a NOR gate connected to receive said lower bit count signal and said upper bit count signal and that produces said counting end signal.

5. The output pulse generator of claim 1, wherein said counter load flip-flop and said output pulse flip-flop are connected to receive the clock pulses so as to be gated by the clock pulses.

6. A variable rate output pulse generator for generating an output signal pulse in response to the application of a variable number of input clock pulses, said output pulse generator comprising:

a shift register having 2n flip-flops for cyclically performing a lower bit down count, wherein an end shift register flip-flop asserts a lower bit count signal upon completion of the lower bit down count and one of said shift register flip-flops periodically asserts a shift-down pulse in response to said shift register receiving a set number of clock pulses;

a ripple down counter having m flip-flops for cyclically performing an upper bit down count, wherein said ripple down counter is connected to said shift register for receiving the shift-down pulses and said ripple down counter flip-flops are configured to perform the upper bit down count down count in response to receipt of the shift-down pulses and to generate an upper bit count signal after a variable number of shift-down pulses are received;

a selector connected to said shift register flip-flops for establishing the number of clock pulses that are to be received by said shift register before said shift register asserts the lower bit count signal, wherein said selector establishes the number of clock pulses in response to lower bit counter data applied to said selector when said selector receives a selector data load signal;

a NOR gate assembly connected to said ripple down counter flip-flops for controlling said ripple down counter flip-flops to establish the number of shift-down pulses that are to be received by said ripple down counter before said ripple down counter asserts said upper bit count signal, wherein said NOR gate assembly establishes the number of shift down pulses in response to upper bit counter data applied to said NOR gate assembly when said ripple down counter receives a NOR gate data load signal;

a counting end circuit for receiving said lower bit count signal and said upper bit count signal for asserting a counting end signal when both said lower bit count signal and said upper bit count signal are received;

a counter load flip-flop for receiving the counting end signal, said counter load flip-flop being configured to assert a count load signal for a fixed period of time when said counting end signal is received, wherein said counter load flip-flop forwards said counter load signal to said selector as said selector data load signal and to said NOR gate assembly as said NOR gate data load signal;

an output pulse flip-flop connected to said counter load flip-flop for receiving said counter load signal, wherein when the counter load signal is received, said output pulse flip-flop asserts an intermediate output signal pulse; and an AND gate connected to receive as inputs the clock pulses and the intermediate output signal pulse, said AND gate producing a final output signal pulse.

7. The output pulse generator of claim 6, wherein: said ripple down counter further includes an OR gate connected to receive the outputs of said ripple down flip-flops for producing said upper bit count signal.

8. The output pulse generator of claim 7, wherein said counting end circuit includes a NOR gate connected to receive said lower bit count signal and said upper bit count signal and that produces said counting end signal.

9. The output pulse generator of claim 6, wherein said counting end circuit includes a NOR gate connected to receive said lower bit count signal and said upper bit count signal and that produces said counting end signal.

10. The output pulse generator of claim 6, wherein said counter load flip--flop and said output pulse flip-flop are connected to receive the clock pulses so as to be gated by the clock pulses.

* * * * *